(12) United States Patent
Curtin

(10) Patent No.: US 6,381,733 B1
(45) Date of Patent: Apr. 30, 2002

(54) SYSTEM AND METHOD FOR INSTANTIATING LOGIC BLOCKS WITHIN AN FPGA

(75) Inventor: Steven D. Curtin, Freehold, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/568,017

(22) Filed: May 10, 2000

(51) Int. Cl.[7] ............................................. G06F 17/50
(52) U.S. Cl. ...................................................... 716/17
(58) Field of Search ............................ 716/1, 7, 16, 17

(56) References Cited

U.S. PATENT DOCUMENTS 6,230,303 B1 * 5/2001 Dave .............................. 716/7
6,230,307 B1 * 5/2001 Davis ........................... 716/16

* cited by examiner

*Primary Examiner*—Matthew Smith
*Assistant Examiner*—Thuan Do
(74) *Attorney, Agent, or Firm*—Hitt Chwang & Gaines PC

(57) ABSTRACT

A copying logic block for, and a method of, programming an FPGA and a modular music synthesis processor incorporating the copying logic block or the method. In one embodiment, the copying logic block includes: (1) a block receiver that receives an instantiable logic block via a programming port of the FPGA and (2) a block instantiator, coupled to the block receiver, that creates multiple instantiations of the instantiable logic block within the FPGA in response to a command received via the programming port without requiring each of the multiple instantiations to enter the FPGA via the programming port.

23 Claims, 3 Drawing Sheets

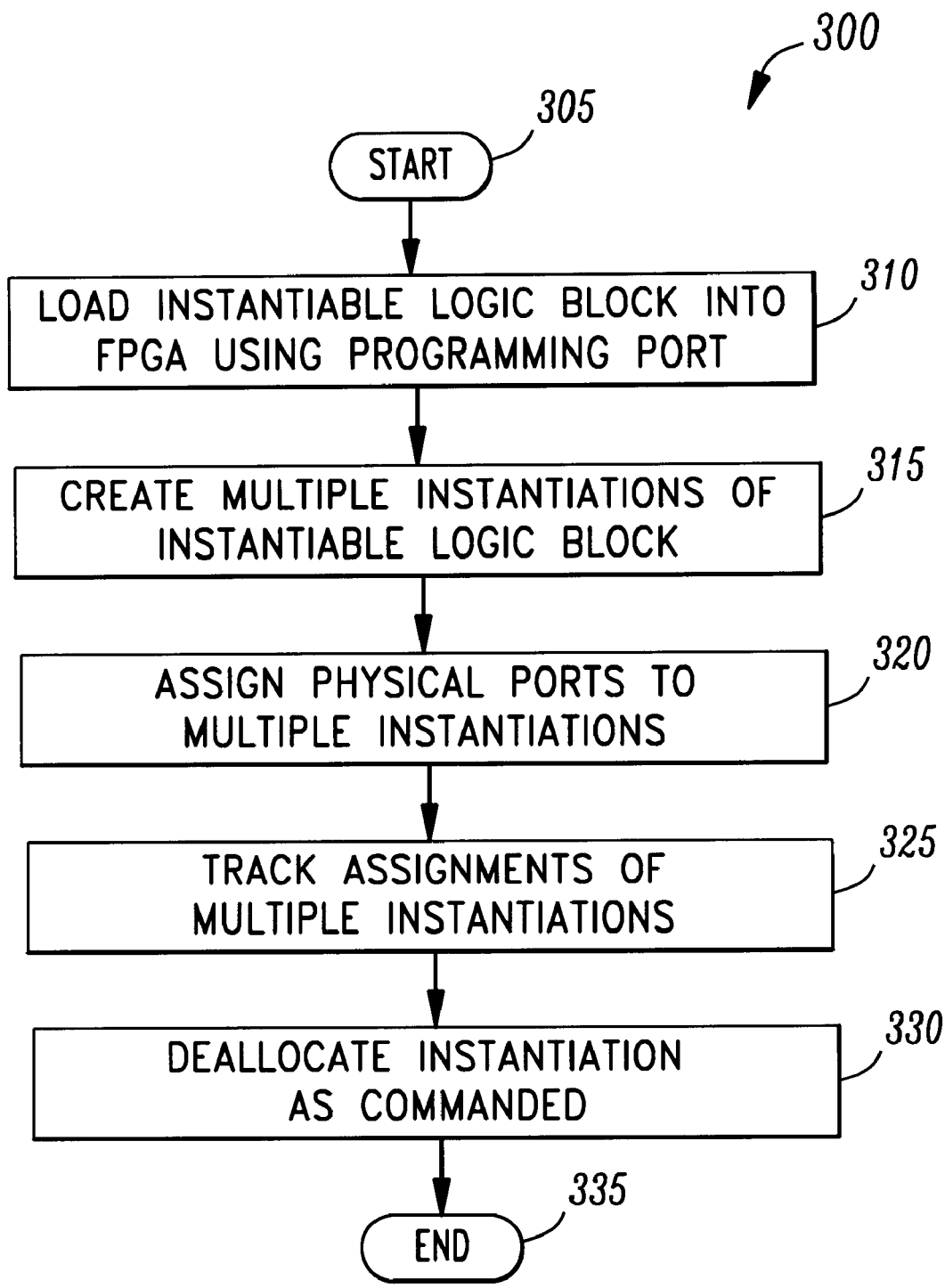

SYSTEM AND METHOD FOR INSTANTIATING LOGIC BLOCKS WITHIN AN FPGA

TECHNICAL FIELD OF THE INVENTION

The present invention is directed, in general, to gate arrays and, more specifically, to a system and method for instantiating logic blocks within a field-programmable gate array (FPGA).

BACKGROUND OF THE INVENTION

The rate of change of technology in the computer and telecommunications fields has generated an increased focus on the ability of designers and marketers of new applications to implement their products more quickly. This is especially true in the area of digital design. Some conventional approaches use Application Specific Integrated Circuits (ASICs), which are especially built to provide a specific implementation of a design. Alternately, designers may also use a more general type of integrated circuit called a gate array that contains unconnected logic elements such as two-input NAND gates.

These gate arrays may be programmed to produce a specific application of a digital design thereby allowing a general logic building block to be tailored for a specific application. This approach may typically reduce the time-to-market for new designs. Regular gate arrays are manufactured by designing and adhering top layers that provide the interconnecting pathways. Although this final masking stage is less costly and may be accomplished more quickly than designing an ASIC, it still requires at least one special manufacturing step.

Field Programmable Gate Arrays (FPGAs) alleviate the need for this special manufacturing step by allowing the specific application instructions to be programmed directly into the gate array. This characteristic replaces the special manufacturing step with a programming step that may be accomplished in the field or as required. This has further reduced the time-to-market for new designs. Additionally, corrections and upgrades to the design may be more easily accomplished through the use of FPGAs.

A single copy of a running program is referred to as an instance or instantiation of the program. In object-oriented programming, an instantiation is typically a member of a class of objects. For example, "Lassie" is an instantiation of the class "dog". Currently, multiple instantiations of a program often require that each of the instantiations be loaded separately into a memory device, such as an FPGA. The use of Very Large-scale Integrated Circuit Programming Language (VHDL) implementations allow multiple instantiations of a logic block to be created.

However, in order to instantiate a logic block in VHDL, a designer must currently change the VHDL source file and then re-link and re-fit the entire file before downloading it to the FPGA. This typically assumes the availability of a host processor to modify the instantiation in the FPGA and may require a high-bandwidth interface to download the resulting bitstream. This is particularly true if an application requires that the logic be time-shared between different functions, or that it be reconfigured frequently.

Accordingly, what is needed in the art is a more appropriate way that an FPGA may internally manage the instantiation of logic blocks.

SUMMARY OF THE INVENTION

To address the above-discussed deficiencies of the prior art, the present invention provides a copying logic block for, and a method of, programming an FPGA and a modular music synthesis processor incorporating the copying logic block or the method. In one embodiment, the copying logic block includes: (1) a block receiver that receives an instantiable logic block via a programming port of the FPGA and (2) a block instantiator, coupled to the block receiver, that creates multiple instantiations of the instantiable logic block within the FPGA in response to a command received via the programming port without requiring each of the multiple instantiations to enter the FPGA via the programming port. In an alternate embodiment of the present invention, the copying logic block is loadable into the FPGA via the programming port.

The present invention recognizes that it is not necessary to burden the programming port with carrying all of the instantiations of a given logic block. Rather, the instantiable logic block can be sent through the programming port and into the FPGA once, and instantiated internally by way of the copying logic block.

In one embodiment of the present invention, the block instantiator assigns physical ports to the multiple instantiations. In a related embodiment, the block instantiator tracks assignment of physical ports to the multiple instantiations. In an embodiment to be illustrated and described, the block instantiator maintains a list of unassigned and assigned physical ports.

In one embodiment of the present invention, the copying logic block further includes a block deallocator, coupled to the block instantiator, that deallocates an instantiation of the instantiable logic block in response to a further command received via the programming port. Thus, the present invention contemplates, but does not require, that one or more of the multiple instantiations may be deallocated, and perhaps replaced with other instantiations of the same or another instantiable logic block.

In one embodiment of the present invention, the logic block is embodied in Very Large-scale Integrated Circuit Hardware Description Language (VHDL). Those skilled in the pertinent art are familiar with VHDL and its current practice with respect to FPGA programming. The present invention can be carried out in any object-oriented language of other Hardware Description Languages, however.

In one embodiment of the present invention, the copying logic block persists once the multiple instantiations are created. This assumes that the copying logic block remains of use after initial instantiation. Some embodiments of the present invention benefit from continuing dynamic instantiation of logic blocks. Alternatively, the copying logic block may be deallocated after initial instantiation and its space freed for containing other logic blocks as may be advantageous.

In one embodiment of the present invention, the instantiable logic block is a structured audio processor. Such structured audio processor may be employed to process or generate one or more channels of audio data in a modular music synthesis processor. Those skilled in the pertinent art will understand, however, that the principles of the present invention are not limited to audio applications.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 3 illustrates a flow diagram of a method of programming the FPGA of FIG. 1.

DETAILED DESCRIPTION

Figure 1:
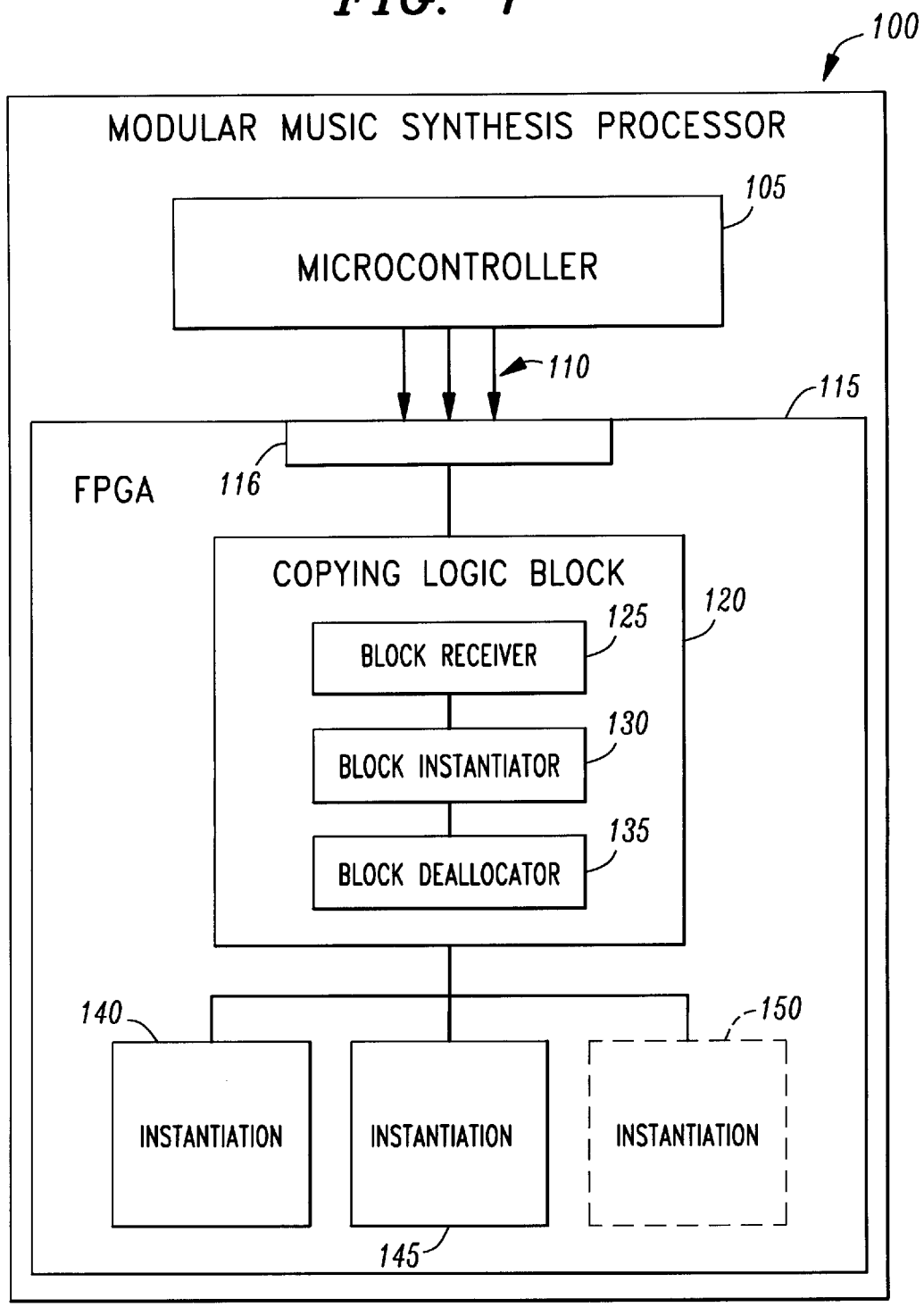
FIG. 1 illustrates a block diagram of a modular music synthesis processor constructed according to the principles of the present invention.

Referring initially to FIG. 1, illustrated is a block diagram of a modular music synthesis processor, generally designated 100, constructed according to the principles of the present invention. The modular music synthesis processor 100 includes a microcontroller 105 coupled to a programming bus 110. The modular music synthesis processor 100 further includes an FPGA 115 having a programming port 116 coupled to the programming bus 110. The FPGA 115 includes a copying logic block 120, which is used for programming the FPGA 115 and first, second and third instantiations 140, 145, 150.

The copying logic block 120 includes a block receiver 125 that receives an instantiable logic block from the microcontroller 105 via the programming port 116. The copying logic block 120 further includes a block instantiator 130, coupled to the block receiver 125, that creates the first, second and third instantiations 140, 145, 150 (collectively referred to as the multiple instantiations 140–150) of the instantiable logic block within the FPGA 115. The multiple instantiations 140–150 are created in response to a command received via the programming port 116 without requiring the microcontroller 105 to transmit each of the multiple instantiations 140–150 to the FPGA 115 via the programming bus 110. In an alternate embodiment, the copying logic block 120 is loadable into the FPGA 115 via the programming port 116.

The copying logic block 120 still further includes a block deallocator 135, coupled to the block instantiator 130, that is capable of deallocating one or more of the multiple instantiations 140–150. In the illustrated embodiment, the deallocator 135 deallocates the third instantiation 150 of the instantiable logic block. This deallocation occurs in response to a further command received by the FPGA 115 via the programming port 116.

In the illustrated embodiment of the present invention, the instantiable logic block is a structured audio processor. The structured audio processor may be employed to process or generate one or more channels of audio data in the modular music synthesis processor 100. Those skilled in the pertinent art will understand, however, that the principles of the present invention are not limited to audio applications.

Figure 2:
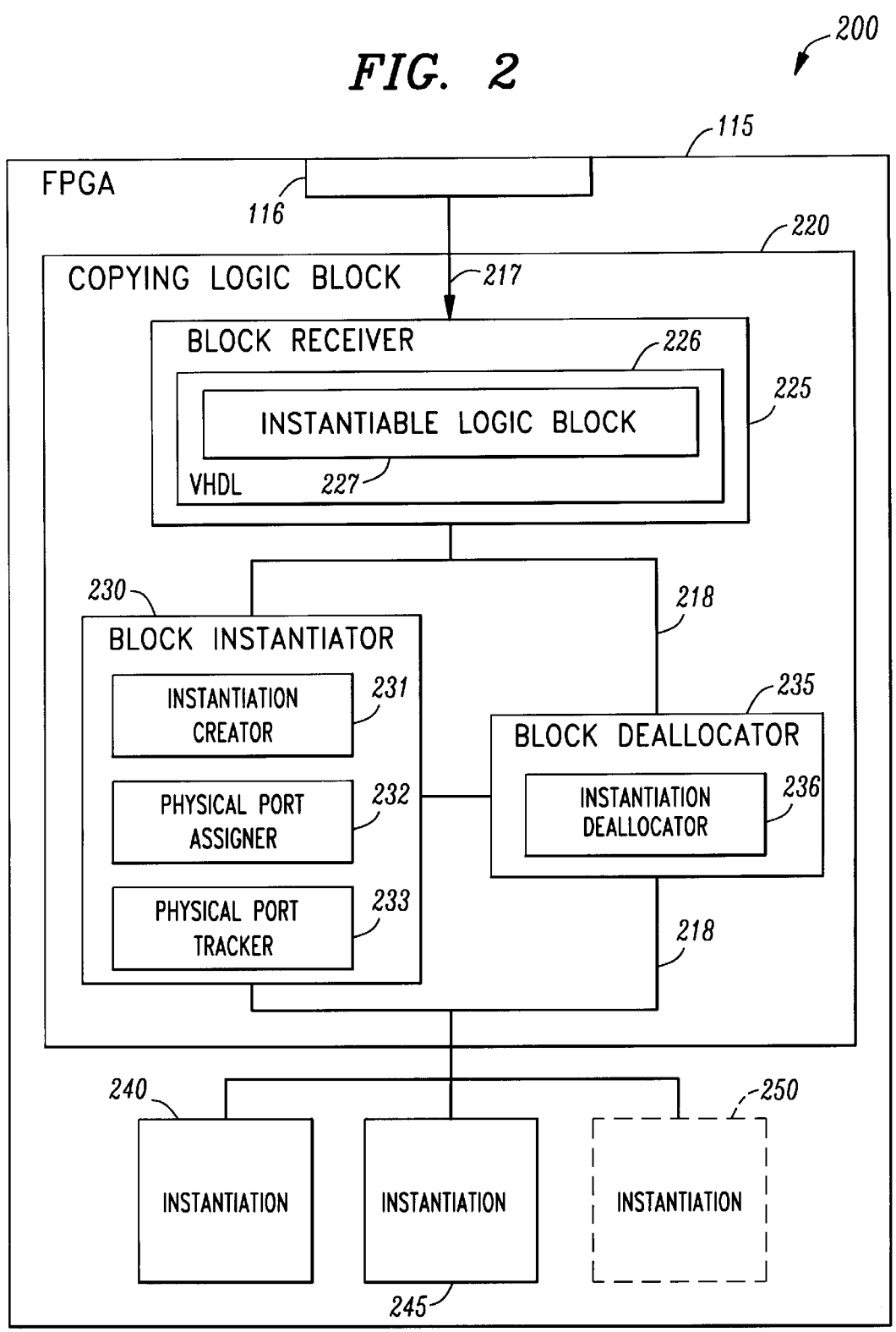
FIG. 2 illustrates an expanded block diagram of an embodiment of the FPGA shown in FIG. 1.

Turning now concurrently to FIGS. 2 and 3, illustrated are an expanded block diagram 200 of an embodiment of the FPGA 115 shown in FIG. 1, and a flow diagram of a method 300 of programming the FPGA 115 of FIG. 1, respectively. The block diagram 200 shows an embodiment of the FPGA 115 that includes the programming port 116, a copying block 220 and first, second and third instantiations 240, 245, 250 (collectively referred to as the multiple instantiations 240–250). The copying block 220 includes a block receiver 225, a block instantiator 230 and a block deallocator 235.

The block receiver 225 receives information over an input bus 217 coupled to the programming port 116 and includes an instantiable logic block 227 embodied in Very Large-scale Integrated Circuit Hardware Description Language (VHDL) shown as a VHDL 226. In the illustrated embodiment, the block instantiator 230 includes an instantiation creator 231, a physical port assigner 232 and a physical port tracker 233. The block deallocator 235, which is coupled to the block instantiator 230, includes an instantiation deallocator 236. In the illustrated embodiment, the block instantiator 230 and the block deallocator 235 receive commands over a command bus 218 coupled to the programming port 116 and share an output bus 218 in the creation or deallocation of instantiations.

In the illustrated embodiment of the present invention, the copying logic block 220 is embodied for use in the FPGA 115 and the method 300 of programming the FPGA 115 is used to create the multiple instantiations 240–250 of the instantiable logic block 227 internally within the FPGA 115. The method 300 starts with loading the instantiable logic block 227 into the FPGA 115 via the programming port 116 in a step 305. The instantiable logic block 227 is also provided to the block receiver 225 via the programming port 116 in a step 310. In another embodiment, a library of instantiable logic blocks may be loaded into the FPGA 115 and the block receiver 225.

In the illustrated embodiment, the instantiable logic block 227 is embodied in VHDL as represented by the VHDL 226. Those skilled in the pertinent art are familiar with VHDL and its current practice with respect to FPGA programming. However, the present invention can be carried out in any object-oriented or other appropriate programming languages.

The block instantiator 230, which is coupled to the block receiver 225, creates the multiple instantiations 240–250 of the instantiable logic block 227 within the FPGA 115 in a step 315. The multiple instantiations 240–250 are created in response to a command received via the programming port 116 without requiring each of the multiple instantiations 240–250 to be downloaded to the FPGA 115 via the programming port 116. In another embodiment, the block instantiator 230 may create an instantiation of an instantiable logic block selected from a library of instantiable logic blocks. The library of instantiable logic blocks may be downloaded to the FPGA or contained within the FPGA.

In the illustrated embodiment, the copying logic block 220 persists once the multiple instantiations 240–250 are created. The copying logic block 220 remains of use after an instantiation of the instantiable logic block 227 to allow the creation of later instantiations and to provide instantiation deallocations as required. This embodiment of the present invention benefits from continuing dynamic instantiation of the same or alternative instantiation logic blocks. Alternatively, the copying logic block 220 may be deallocated after initial instantiation and its space freed for containing other logic blocks as may be advantageous.

Additionally, the block instantiator 230 uses the physical port assigner 232 to assign physical ports to the multiple instantiations 240–250 in a step 320. The physical port tracker 233 then tracks assignment of physical ports to the multiple instantiations 240–250 in a step 325. In the illustrated embodiment, the block instantiator 230 maintains a list of unassigned and assigned physical ports.

In the illustrated embodiment, the FPGA 115 uses the block deallocator 235 to deallocate the third instantiation 250 of the instantiable logic block 227 in a step 330. This is accomplished in response to a further command received via the programming port 116. The third instantiation 250 is thereby deallocated after it was created in the step 315. Thus, the present invention contemplates, but does not require, that one or more of the multiple instantiations 240–250 may be deallocated. Additionally, an instantiation may be replaced with other instantiations of the same or another instantiable logic block. The method 300 ends in a step 335.

In summary, the present invention recognizes that it is not necessary to burden the programming port of an FPGA constructed according to the principles of the illustrated embodiments with carrying all of the instantiations of a given logic block. Rather, the instantiable logic block can be sent through the programming port and into the FPGA once, and instantiated internally by way of the copying logic block. Of course, as illustrated in the described embodiments, as many instantiations may be created as required subject to the capacity of an FPGA. These internally created instantiations may also be created from differing instantiable logic blocks loaded sequentially or that may exist concurrently in the FPGA. Further, an existing instantiation may be deallocated as required or desired.

Although the present invention has been described in detail, those skilled in the art should understand that they can make various changes, substitutions and alterations herein without departing from the spirit and scope of the invention in its broadest form.

What is claimed is:

1. A copying logic block for programming an FPGA, comprising:
   a block receiver that receives an instantiable logic block via a programming port of said FPGA; and
   a block instantiator, coupled to said block receiver, that creates multiple instantiations of said instantiable logic block within said FPGA in response to a command received via said programming port without requiring each of said multiple instantiations to enter said FPGA via said programming port.

2. The copying logic block as recited in claim 1 wherein said block instantiator assigns physical ports to said multiple instantiations.

3. The copying logic block as recited in claim 1 wherein said block instantiator tracks assignment of physical ports to said multiple instantiations.

4. The copying logic block as recited in claim 1 further comprising a block deallocator, coupled to said block instantiator, that deallocates an instantiation of said instantiable logic block in response to a further command received via said programming port.

5. The copying logic block as recited in claim 1 wherein said logic block is embodied in Very Large-scale Integrated Circuit Hardware Description Language (VHDL).

6. The copying logic block as recited in claim 1 wherein said copying logic block persists once said multiple instantiations are created.

7. The copying logic block as recited in claim 1 wherein said instantiable logic block is a structured audio processor.

8. The copying logic block as recited in claim 1 wherein said copying logic block is loadable into said FPGA via a programming port thereof.

9. A method of programming an FPGA, comprising:
   loading an instantiable logic block into said FPGA via a programming port thereof; and
   creating multiple instantiations of said instantiable logic block within said FPGA in response to a command received via said programming port without requiring each of said multiple instantiations to enter said FPGA via said programming port.

10. The method as recited in claim 9 further comprising assigning physical ports to said multiple instantiations.

11. The method as recited in claim 9 further comprising tracking assignment of physical ports to said multiple instantiations.

12. The method as recited in claim 9 further comprising deallocating an instantiation of said instantiable logic block in response to a further command received via said programming port.

13. The method as recited in claim 9 wherein said logic block is embodied in Very Large-scale Integrated Circuit Hardware Description Language (VHDL).

14. The method as recited in claim 9 further comprising allowing further instantiations to be created after said creating.

15. The method as recited in claim 9 wherein said instantiable logic block is a structured audio processor.

16. A modular music synthesis processor, comprising:
   a microcontroller;
   a programming bus coupled to said microcontroller;
   an FPGA having a programming port coupled to said programming bus; and
   a copying logic block for programming said FPGA, including:
      a block receiver that receives an instantiable logic block from said microcontroller via said programming port, and
      a block instantiator, coupled to said block receiver, that creates multiple instantiations of said instantiable logic block within said FPGA in response to a command received via said programming port without requiring said microcontroller to transmit each of said multiple instantiations to said FPGA via said programming bus.

17. The modular music synthesis processor as recited in claim 16 wherein said block instantiator assigns physical ports to said multiple instantiations.

18. The modular music synthesis processor as recited in claim 16 wherein said block instantiator tracks assignment of physical ports to said multiple instantiations.

19. The modular music synthesis processor as recited in claim 16 wherein said copying logic block further includes a block deallocator, coupled to said block instantiator, that deallocates an instantiation of said instantiable logic block in response to a further command received via said programming port.

20. The modular music synthesis processor as recited in claim 16 wherein said logic block is embodied in Very Large-scale Integrated Circuit Hardware Description Language (VHDL).

21. The modular music synthesis processor as recited in claim 16 wherein said copying logic block persists once said multiple instantiations are created.

22. The modular music synthesis processor as recited in claim 16 wherein said instantiable logic block is a structured audio processor.

23. The modular music synthesis processor as recited in claim 16 wherein said copying logic block is loadable into said FPGA via said programming.

* * * * *